(12) United States Patent
Masuda et al.

(10) Patent No.: US 7,974,042 B2
(45) Date of Patent: Jul. 5, 2011

(54) THIN FILM DEVICE HAVING LEAD CONDUCTOR FILM

(75) Inventors: Takahide Masuda, Tokyo (JP); Masashi Sano, Tokyo (JP); Hiroki Aritomo, Tokyo (JP)

(73) Assignee: TDK Corporation, Tokyo (JP)

( * ) Notice: Subject to any disclaimer, the term of this patent is extended or adjusted under 35 U.S.C. 154(b) by 987 days.

(21) Appl. No.: 11/736,784

(22) Filed: Apr. 18, 2007

(65) Prior Publication Data

US 2008/0261079 A1 Oct. 23, 2008

(51) Int. Cl.
*G11B 5/17* (2006.01)
*G11B 5/48* (2006.01)
*G11B 21/16* (2006.01)

(52) U.S. Cl. .............. 360/123.36; 360/245.8; 360/234.5

(58) Field of Classification Search ............... 360/264.2, 360/234.5, 266.3, 245.8, 123.36
See application file for complete search history.

(56) References Cited

U.S. PATENT DOCUMENTS

| | | | | |
|---|---|---|---|---|
| 4,856,181 | A * | 8/1989 | Pichler et al. ............. | 29/603.14 |
| 2005/0030666 | A1* | 2/2005 | Sasaki et al. ................. | 360/128 |
| 2005/0047016 | A1* | 3/2005 | Koide et al. ................. | 360/234.5 |
| 2007/0195457 | A1 | 8/2007 | Matono et al. | |

FOREIGN PATENT DOCUMENTS

| | | |
|---|---|---|
| JP | 8-30954 | 2/1996 |
| JP | 10-3614 | 1/1998 |
| JP | 2927768 | 5/1999 |
| JP | 2002-157704 | 5/2002 |
| JP | 2003-147542 | 5/2003 |
| JP | 2003-226993 | 8/2003 |
| JP | 2003-243498 | 8/2003 |
| JP | 2004-43958 | 2/2004 |
| JP | 2004-360006 | 12/2004 |
| JP | 2007-257815 | 10/2007 |

* cited by examiner

*Primary Examiner* — Craig A. Renner
*Assistant Examiner* — Adam B Dravininkas
(74) *Attorney, Agent, or Firm* — Oblon, Spivak, McClelland, Maier & Neustadt, L.L.P.

(57) ABSTRACT

The present invention relates to a thin-film device whose bump has an improved surface property. A thin-film element of the thin-film device includes at least one of an electromagnetic conversion element, a passive element and an active element. A lead conductor film containing Cu as a main component is connected to the thin-film element. The lead conductor is provided with a bump. The bump includes a first conductor film and a second conductor film. The first conductor film is adhered onto the lead conductor film and is a Ta film or made of a material having a comparably fine crystal structure. The second conductor film is a plated film which is directly or indirectly formed on the first conductor film and contains Au as a main component.

18 Claims, 14 Drawing Sheets

THIN FILM DEVICE HAVING LEAD CONDUCTOR FILM

TECHNICAL FIELD

The present invention relates to a thin-film device, a thin-film magnetic head, a head assembly, a magnetic recording/reproducing apparatus, and a method for manufacturing the thin-film device.

BACKGROUND OF THE INVENTION

Thin-film devices covered by the present invention include a circuit element such as an inductor, as well as a thin-film device using a magneto-resistive effect element (hereinafter referred to as "MR element"). Among them, the MR element is used not only as a magnetic detecting element or a magnetic memory but also as a reproducing element for a thin-film magnetic head. The inductor forms an independent circuit element by itself and is also used as a recording element for a thin-film magnetic head.

Typically, thin-film devices of this type tend to have a protective structure with a thin-film element embedded in an insulating film. This structure requires a lead conductor film for enabling electrical contact of the thin-film element inside the insulating film with the outside. Typically, the lead conductor film has a three-dimensional wiring structure composed of a planar portion and a projecting portion, wherein one end of the planar portion is connected to the thin-film element and at the other end, the projecting portion projects from the film surface of the planar portion in a film thickness direction of the insulating film. Moreover, the upper end of the projecting portion is led out to the surface of the insulating film, and a bump for external connection is formed on the led-out upper end face.

The projecting portion is formed as a plated film containing Cu as a main component because it is required to have a decreased electrical resistance and a relatively large thickness. Since the surface of the bump is intended to be connected to external wiring such as by bonding means, its outermost layer is formed by an Au plated film so as to meet the demand. For example, Japanese Unexamined Patent Application Publication No. H10-3614 can be cited as a prior art document in which the above bump structure is applied to a thin-film magnetic head.

In order to reliably perform wire bonding on the bump, however, the Au plated film to which the wire is to be bonded must have an excellent surface property. This is because poor surface property of the Au plated film lead to a problem of decrease in bonding strength or the like. Particularly in a thin-film device that requires a mechanical polishing process, typically a thin-film magnetic head, a polishing powder generated by slider processing or the like tends to be captured by unevenness on the surface of the Au plated film, interfering with bonding.

In a conventional bump structure in which the projecting portion of the lead conductor film is formed by a Cu plated film and an Au plated film is grown thereon using a Ti film as a seed film, however, the Au plated film grows to inherit the crystal structure of the Cu plated film (or epitaxially grows), which results in that the surface of the Au plated film becomes an uneven surface reflecting the crystal size and shape of the Cu plated film. This limits the improvement in surface property of the bump.

SUMMARY OF THE INVENTION

It is an object of the present invention to provide a thin-film device with a bump having an excellent surface property.

It is another object of the present invention to provide a thin-film magnetic head with a bump having an excellent surface property, and a head assembly using the thin-film magnetic head, and also a magnetic recording/reproducing apparatus.

It is still another object of the present invention to provide a method suitable for manufacturing the above thin-film device and thin-film magnetic head.

1. Thin-Film Device

To achieve the above objects, a thin-film device according to the present invention comprises a thin-film element, a lead conductor film and a bump. The thin-film element is at least one selected from an electromagnetic conversion element, a passive element and an active element. The lead conductor film contains Cu as a main component and is connected to the thin-film element. The bump is a portion to which an outer conductor is to be connected and includes at least a first conductor film and a second conductor film. The first conductor film is adhered onto the lead conductor film and is a Ta film or made of a material having a comparably fine crystal structure. The second conductor film is a plated film which is directly or indirectly formed on the first conductor film and contains Au as a main component.

Of the first and second conductor films of the bump in the thin-film device according to the present invention, as described above, the first conductor film adhered onto the lead conductor film containing Cu as a main component is formed by a Ta film. The Ta film has a finer crystal film structure than a conventionally used Ti film. Accordingly, even if large crystals are formed inside the lead conductor film by its main component Cu, they can be shut off by the Ta film, thereby preventing the Au plated film formed on the Ta film from reflecting the crystal shape of Cu. Thus, the bump formed by the Au plated film has an improved surface property.

The first conductor film, which is a Ta film or made of a material having a comparably fine crystal structure, may have a film thickness in the range of 5 to 15 nm. In addition, between the first conductor film and the second conductor film, the bump may have a third conductor film containing Au as a main component.

2. Method for Manufacturing the Thin-Film Device

In a production process of the above thin-film device, the bump is formed after formation of the thin-film element and the lead conductor film. For formation of the bump, at first, the first conductor film, which is a Ta film or made of a material having a comparably fine crystal structure, is formed on the lead conductor film. The first conductor film may be formed by sputtering.

Then, the second conductor film, which is a plated film containing Au as a main component, is directly or indirectly formed on the first conductor film.

At this time, since the Ta film functioning as a seed film for the second conductor film, which is a plated film containing Au as a main component, has a film structure whose crystals are considerably finer than those of a Ti film, there can be suppressed a phenomenon that the Au plated film grows to inherit the crystal structure of the Cu plated film. The surface of the Au plated film, which inherits only the fine crystal structure of the Ta film, has an excellent surface property without substantially reflecting the crystal size and shape of the Cu plated film.

3. Thin-Film Magnetic Head

A thin-film magnetic head according to the present invention is a typical example of the above thin-film device. The thin-film magnetic head includes a slider, at least one electromagnetic conversion element, a lead conductor film and a bump. The electromagnetic conversion element is supported by the slider.

To the lead conductor film and the bump, the technical features described with respect to the above thin-film device are applicable as they are. Accordingly, the effects and advantages described with respect to the thin-film device are also true for the thin-film magnetic head.

However, as a typical structure of a thin-film magnetic head, the thin film element is formed by an electromagnetic conversion element. The electromagnetic conversion element includes a recording element and a reproducing element. As the recording element, there may be employed not only a longitudinal recoding element but also a perpendicular recording element that is now becoming mainstream. As the reproducing element, for example, there may be employed a giant magneto-resistive effect (GMR) or a tunneling magneto-resistive effect (TMR).

3. Head Assembly and Magnetic Recording/Reproducing Apparatus

The present invention also discloses a head assembly and a magnetic recording/reproducing apparatus using the above thin-film magnetic head. The head assembly includes the above thin-film magnetic head and a head support device. The head support device supports the thin-film magnetic head in such a manner as to permit rolling and pitching of the thin-film magnetic head. In the present invention, examples of the head assembly include an HGA (head gimbal assembly) in which the thin-film magnetic head is mounted on a head support device (or gimbal) and an HAA (head arm assembly) in which the HGA is mounted on an arm.

The magnetic recording/reproducing apparatus according to the present invention includes the above head assembly and a magnetic recording medium. A typical example of the magnetic recording/reproducing apparatus is a hard disk drive (HDD) using a magnetic recording medium called "hard disk".

The other objects, constructions and advantages of the present invention will be further detailed below with reference to the attached drawings. However, the attached drawings show only illustrative examples.

DESCRIPTION OF THE PREFERRED EMBODIMENTS

1. Thin-Film Device

Figure 1:
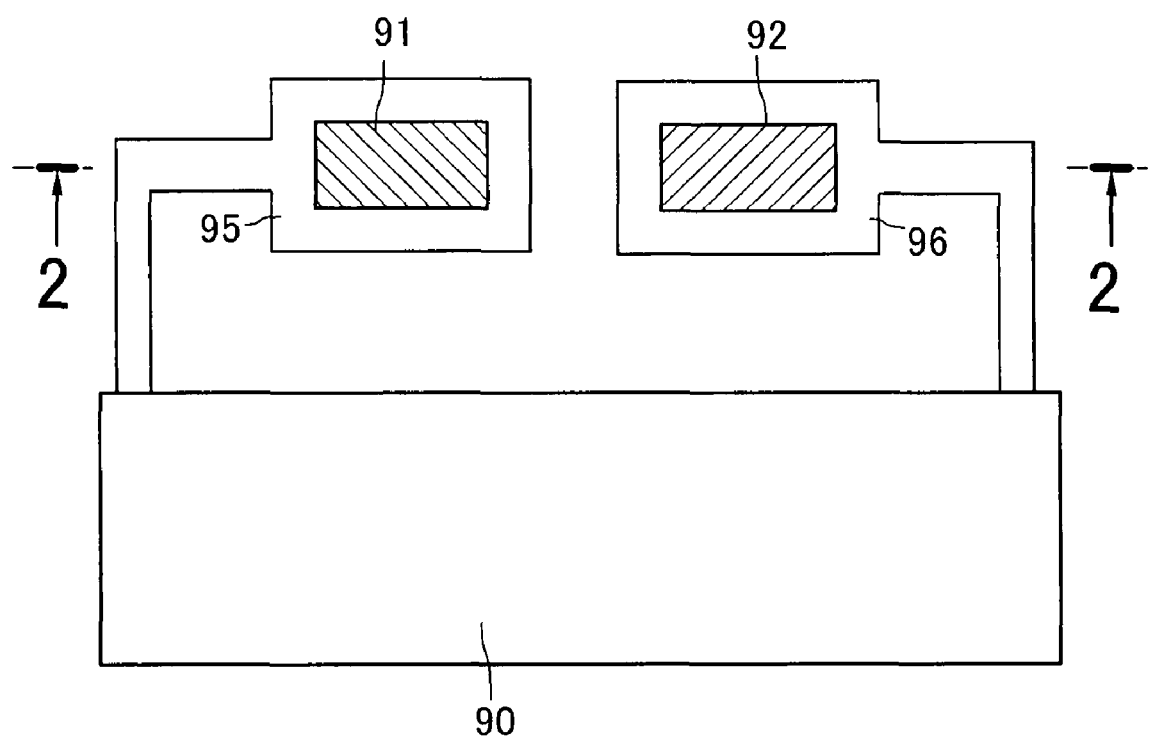
FIG. 1 is a plan view of a thin-film device according to the present invention.
Figure 2:
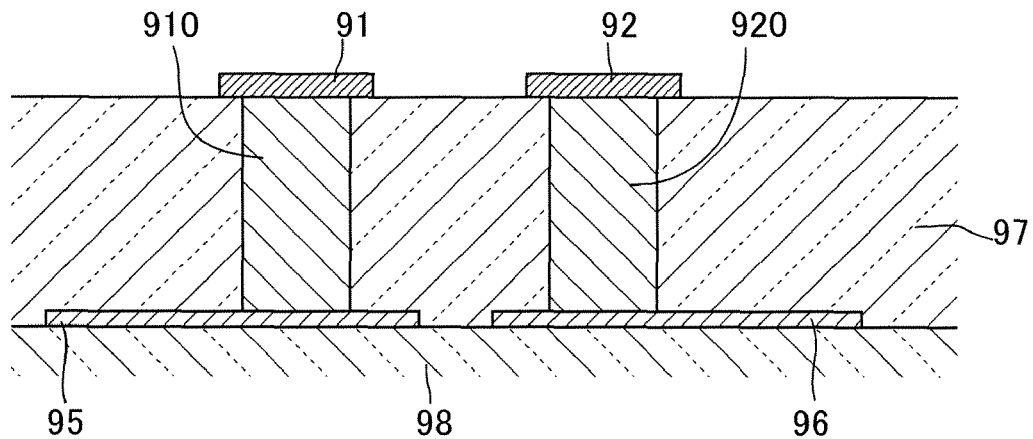
FIG. 2 is a sectional view taken along line 2-2 in FIG. 1.
Figure 3:
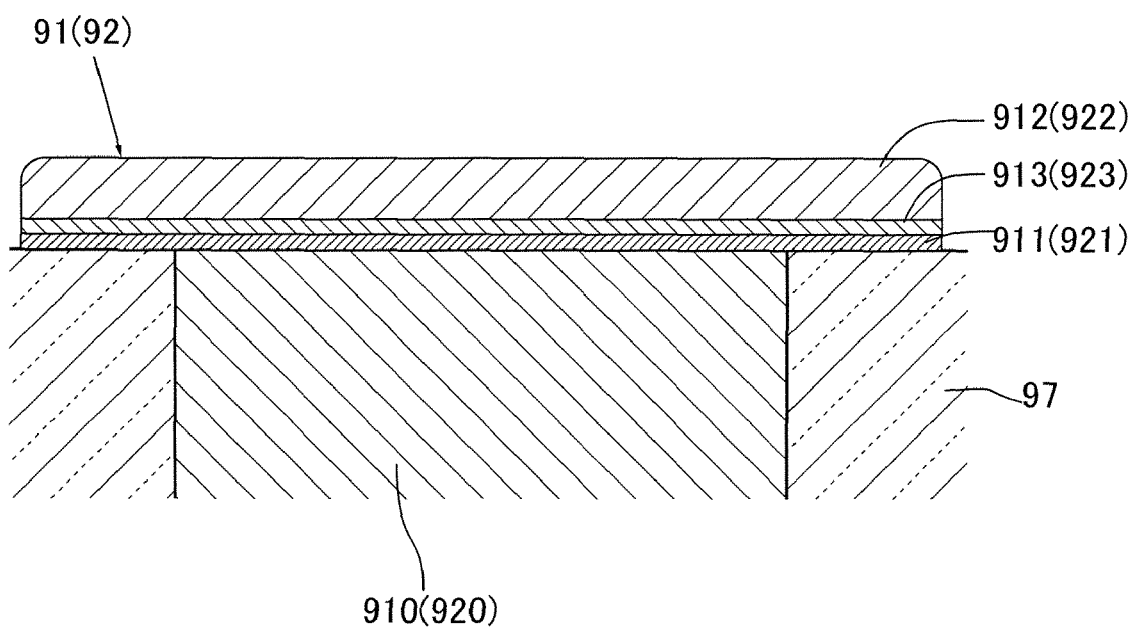
FIG. 3 is an enlarged sectional view of FIG. 2.

A thin-film device illustrated in FIGS. 1 to 3 includes a thin-film element 90, a lead conductor film (95, 910), a lead conductor film (96, 920), and bumps 91, 92.

The thin-film element 90 is in the form of a thin-film and at least one selected from an electromagnetic conversion element, a passive element and an active element. More specifically, examples include a MR element or a recording element for use in a thin-film magnetic head, a memory element for use in a MRAM (magnetoresistive random access memory), a magnetic sensor element, a coil element, a resistive element, and a capacitor element. They may be used alone or in combination with each other. The thin-film magnetic head is a typical example of a case where a MR element is combined with a coil element. The MR element may include a SV film or a TMR film. The thin-film device according to the present invention may be an assembly of an array of thin-film elements 90 or may be an individual body.

The lead conductor film (95, 910) and the lead conductor film (96, 920) contain Cu as a main component and are connected to the thin-film element 90. Although two lead conductor films (95, 910), (96, 920) are illustrated in the drawings, the number is arbitrary. Of the two, one lead conductor film (95, 910) has a planar portion 95 and a projecting portion 910 and is embedded in an insulating film 97 except one end face of the projecting portion 910. The projecting portion 910 is a Cu plated film projecting from the planar portion 95 with its one end face substantially flush with the surface of the insulating film 97.

The other lead conductor film (96, 920) also has a planar portion 96 and a projecting portion 920 and is embedded in the insulating film 97 except one end face of the projecting portion 920. The projecting portion 920 is a Cu plated film projecting from the planar portion 96 with its one end face substantially flush with the surface of the insulating film 97.

The bumps 91, 92 are portions to which an outer conductor is to be connected, and its detailed film structure is illustrated in FIG. 3. Referring to FIG. 3, at first, the bump 91 includes at least a first conductor film 911 and a second conductor film 912. The first conductor film 911 is adhered onto the lead conductor film 910 such as by sputtering and is a Ta film or made of a material having a comparably fine crystal structure. The second conductor film 912 is a plated film which is directly or indirectly formed on the first conductor film 911 and contains Au as a main component. The bump 91 may have a third conductor film 913 which is formed between the first conductor film 911 and the second conductor film 912 such as by sputtering and contains Au as a main component.

Just like the bump 91, the bump 92 is a portion to which an outer conductor is to be connected. The bump 92 includes at least a first conductor film 921 and a second conductor film 922. The first conductor film 921 is adhered onto the lead conductor film 920 such as by sputtering and is a Ta film or made of a material having a comparably fine crystal structure. The second conductor film 922 is a plated film which is directly or indirectly formed on the first conductor film 921 and contains Au as a main component. The bump 92 may also have a third conductor film 923 which is formed between the first conductor film 921 and the second conductor film 922 such as by sputtering and contains Au as a main component.

The insulating film 97 embedded with the lead conductor film (95, 910) and the lead conductor film (96, 920) is generally formed by a ceramic film such as of $Al_2O_3$. In this case, the one end faces of the projecting portions 910, 920 and the surface of the insulating film 97 constitute a polished surface obtained by polishing them flush with each other. Since the one end faces of the projecting portions 910, 920 are improved in surface property by polishing, the Ta film formed thereon has an improved surface property.

The first conductor films 911, 921, which are a Ta film or made of a material having a comparably fine crystal structure, may have a film thickness in the range of 5 to 15 nm.

Of the first and second conductor films (911, 921) and (912, 922) of the bumps 91, 92 in the thin-film device according to the present invention, as described above, the first conductor films 911, 921 adhered onto the lead conductor films 910, 920 containing Cu as a main component are formed by a Ta film. The Ta film has a considerably finer crystal film structure than a conventionally used Ti film. Accordingly, even if large crystals are formed inside the lead conductor films 910, 920 by their main component Cu, they can be shut off by the first conductor films 911, 921, which are a Ta film, thereby preventing the second conductor films 912, 922 formed on the first conductor films 911, 921 from reflecting the crystal shape of Cu forming the lead conductor films 910, 920. Thus, the bumps 91, 92 formed by the second conductor films 912, 922, which are an Au plated film, have an improved surface property. The improvement in surface property will be further detailed through the following description of a method for manufacturing a thin-film device.

2. Method for Manufacturing the Thin-Film Device

A method for manufacturing the above thin-film device will be described with reference to FIGS. 4 to 11. All the processes described below are performed on a wafer.

Figure 4:
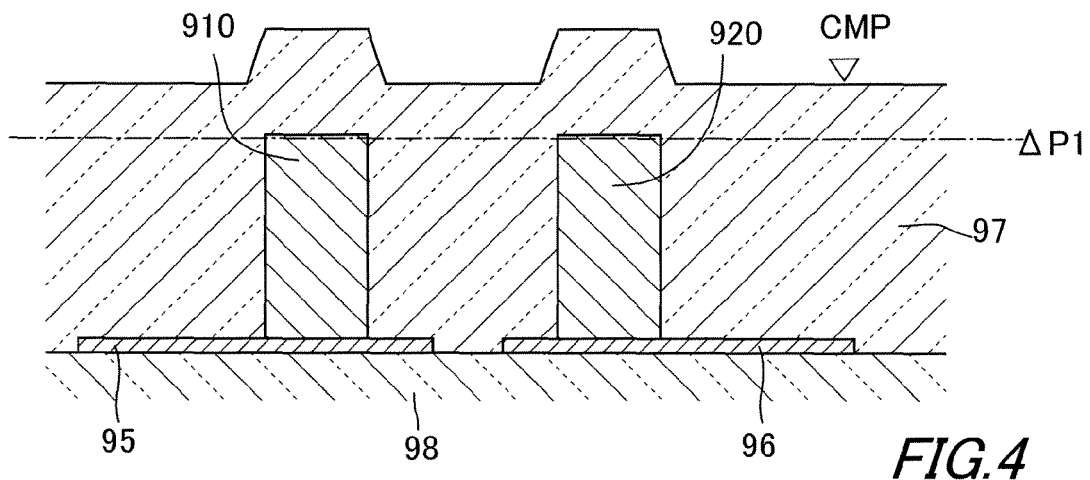
FIG. 4 is a view showing a step for manufacturing the thin-film device shown in FIG. 1.

At first, after the insulating film 97 such as of $Al_2O_3$ is sputtered around the lead conductor film (95, 910) and the lead conductor film (96, 920) formed on an insulating support 98, as shown in FIG. 4, it is polished by polishing means such as CMP (chemical mechanical polishing) to a level Δ P1 reaching the end faces of the lead conductor films 910, 920. Although not illustrated in the drawings, the thin-film element 90 in FIG. 1 is also covered with the insulating film 97.

Figure 5:
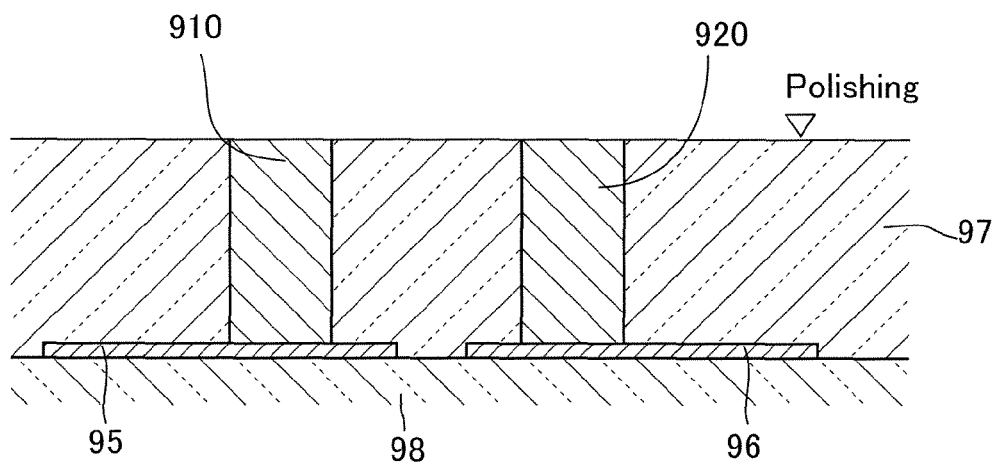
FIG. 5 is a partially enlarged sectional view after the step of FIG. 4.
Figure 6:
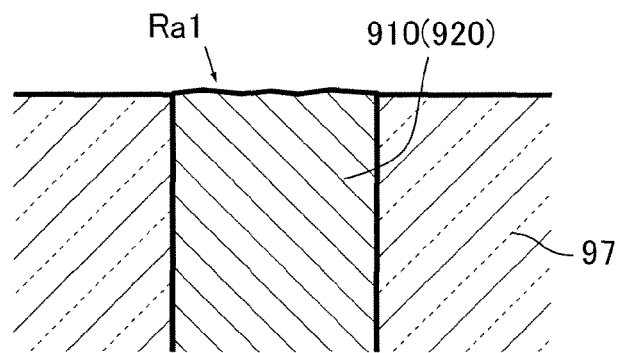
FIG. 6 is a view showing a step after the step shown in FIGS. 4 and 5.

Through the above flattening process, the end faces of the lead conductor films 910, 920 are polished flush with the surface of the insulating film 97, as shown in FIG. 5. As shown in FIG. 6 on an enlarged scale, the polished surfaces of the lead conductor films 910, 920 have a certain degree of surface roughness Ra1. If the surface roughness Ra1 is too great, the surface property of a film to be formed thereon will deteriorate. The surface roughness Ra1 is preferably in the range of approximately 0.1 to 0.7 nm, more preferably in the range of 0.2 to 0.6 nm.

Figure 7:
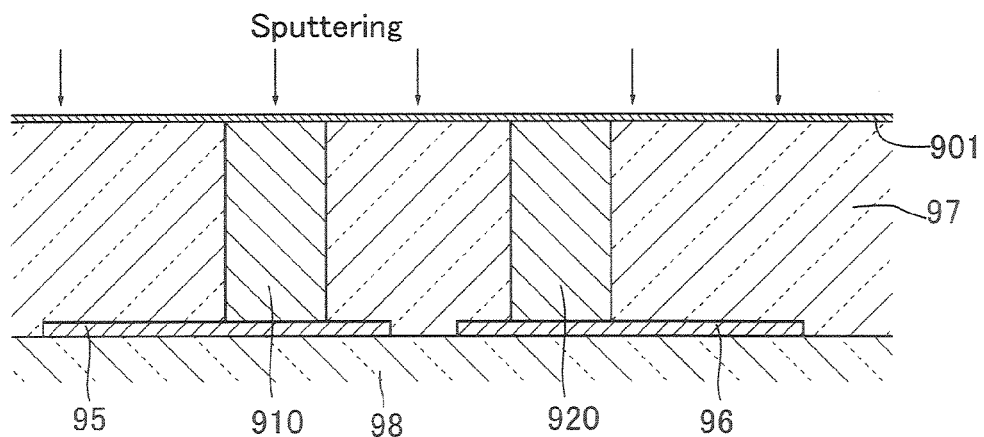
FIG. 7 is a partially enlarged sectional view after the step of FIG. 6.

Next, as shown in FIG. 7, a first conductor film 901, which is a Ta film, is sputtered on the end faces of the lead conductor films 910, 920 and the surface of the insulating film 97. Sputtering of the first conductor film 901 is performed such that its film thickness ranges from 5 to 15 nm. If it is less than 5 nm, the surface of the first conductor film 901 is susceptible to the surface roughness Ra1 of the lead conductor films 910, 920. Being greater than 15 nm is not desirable because of the effect of the electrical resistance of the first conductor film 901, which is a Ta film.

Figure 8:
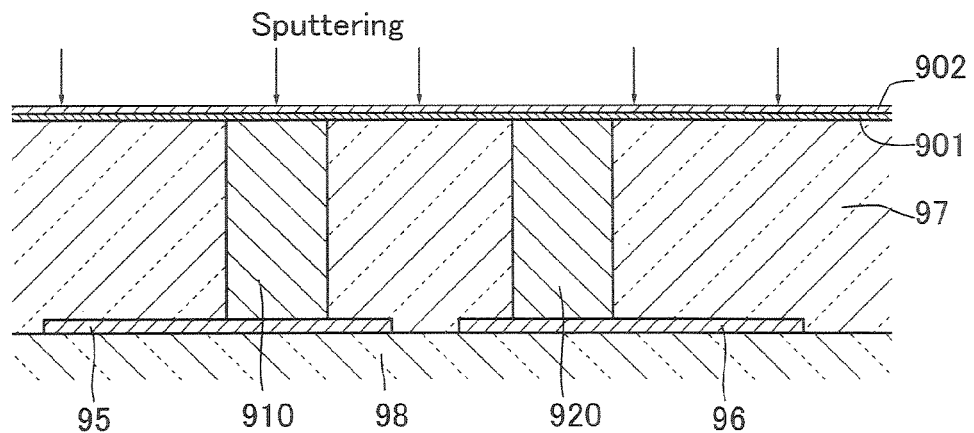
FIG. 8 is a view showing a step after the step shown in FIGS. 6 and 7.

Then, as shown in FIG. 8, a third Au conductor film 902 is sputtered on the surface of the first conductor film 901, which is a Ta film. As with the first conductor film 901, sputtering of the third conductor film 902 may be performed such that its film thickness ranges from 5 to 15 nm.

Figure 9:
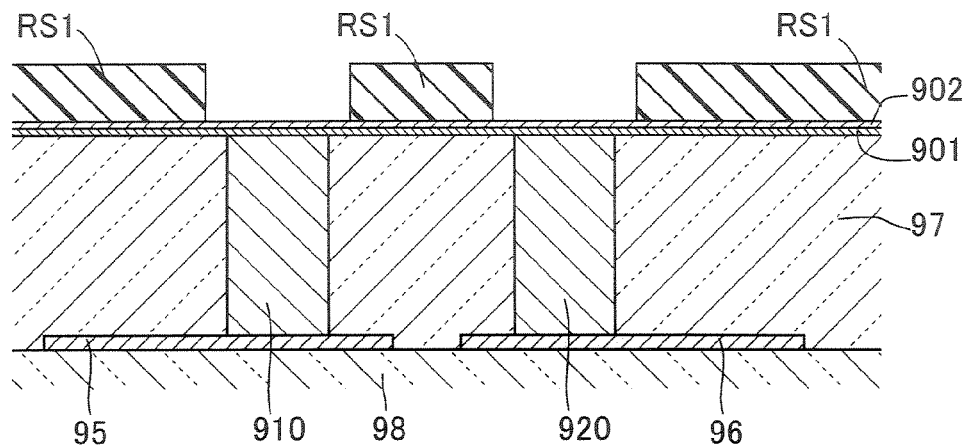
FIG. 9 is a view showing a step after the step shown in FIG. 8.

Next, as shown in FIG. 9, a resistmask RS1 is formed on the surface of the third conductor film 902 by performing a high precision patterning technology such as a photolithographic process on the surface of the third conductor film 902. The resistmask RS1 is formed with a pattern of openings above the lead conductor films 910, 920.

Figure 10:
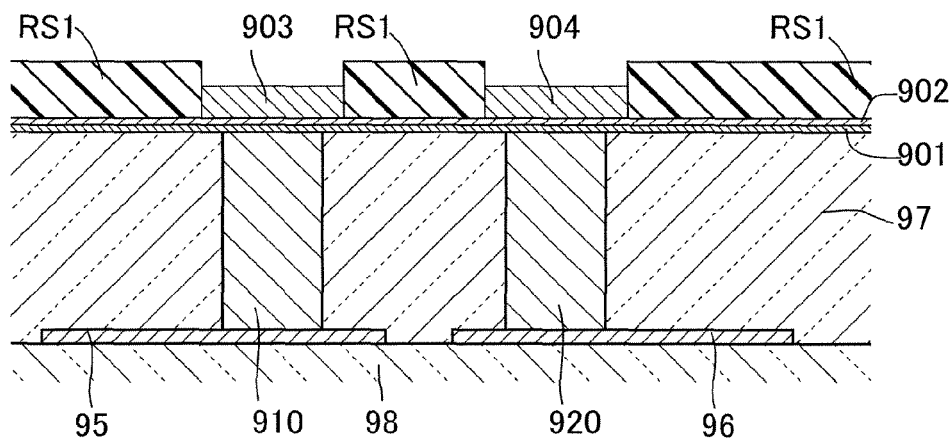
FIG. 10 is a view showing a step after the step shown in FIG. 9.

Then, as shown in FIG. 10, plating is performed to grow Au plated films 903, 904 on the third conductor film 902, which is an Au sputtered film, within the pattern of openings above the lead conductor films 910, 920. The Au plated films 903, 904 are formed with a film thickness in the range of approximately 150 to 300 nm.

Figure 11:
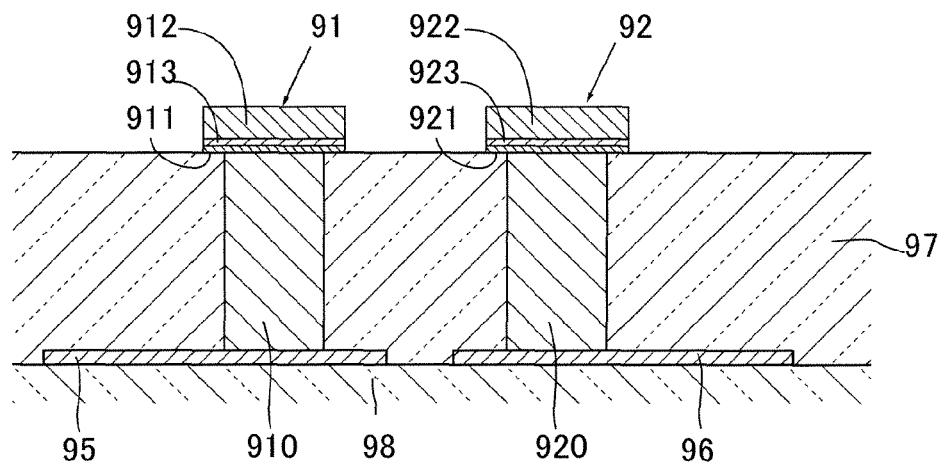
FIG. 11 is a view showing a step after the step shown in FIG. 10.

Next, after the resistmask RS1 is removed by adopting a chemical etching method or the like, the portions not to be etched, such as the surfaces of the plated films 903, 904, are masked and well-known dry etching is performed for patterning of the third conductor film 902 and the first conductor film 901. Thus, as shown in FIG. 11, the bumps 91, 92 of a required size are formed on the lead conductor films 910, 920.

The bump 91 has a three-layer structure of the first conductor film 911 obtained by patterning the first Ta conductor film 901, the third Au conductor film 913 obtained by patterning the third conductor film 902, and the Au plated film 912. The bump 92 also has a three-layer structure of the first conductor film 921 obtained by patterning the first Ta conductor film 901, the third Au conductor film 923 obtained by patterning the third conductor film 902, and the Au plated film 922.

Here, since the first conductor films 911, 921 adhered onto the lead conductor films 910, 920 containing Cu as a main component are a Ta film having a film structure whose crystals are considerably finer than those of a conventionally used Ti film, even if large crystals are formed inside the lead conductor films 910, 920 by their main component Cu, they can be shut off by the Ta films 911, 921. This prevents the third conductor films 913, 923 and the plated films 912, 922 formed above the first conductor films 911, 921, which are a Ta film, from reflecting the crystal shape of Cu. Thus, the bumps 91, 92 formed by the Au plated films 912, 922 have an improved surface property.

Next will be detailed the effects of the present invention with reference to experimental data. At first, wafer samples S11 to S61 were prepared, and then a Cu plated film corresponding to the lead conductor films 910, 920 was formed on one side thereof, followed by mechanochemical polishing to polish its surface. Cu-2S was used as slurry.

Figure 12:
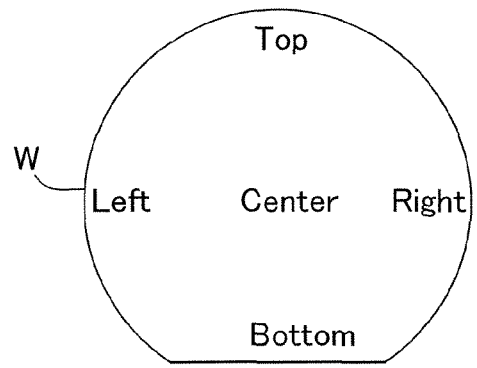
FIG. 12 is a view showing surface roughness measuring points on a wafer.

For the wafer samples S11 to S61 after polishing, the results of measurement of surface roughness Ra on the surface of the Cu plated film are shown. The positions "center", "bottom", "top", "right" and "left" in Table 1 refer to positions on the wafer and are illustrated in FIG. 12. The surface roughness Ra was measured using a stylus surface roughness tester.

TABLE 1

| Sample No. | Surface roughness Ra | | | | |
|---|---|---|---|---|---|
| | Center (nm) | Top (nm) | Bottom (nm) | Left (nm) | Right (nm) |
| S11 | 0.30 | 0.33 | 0.41 | | |
| S21 | 0.68 | 0.32 | 0.31 | | |
| S31 | 0.20 | 0.35 | 0.46 | | |
| S41 | 0.45 | 0.53 | | | |
| S51 | 0.47 | 0.40 | 0.38 | 0.36 | 0.37 |
| S61 | 0.44 | 0.41 | 0.41 | 0.39 | 0.39 |

Next, for the samples S11 to S31, a Ti sputtered film (first conductor film) was formed on the polished Cu plated film, and an Au sputtered film (third conductor film) was formed on the Ti sputtered film, and moreover, an Au plated film (second conductor film) was formed thereon. The samples S12 to S32 thus obtained correspond to conventional ones.

On the other hand, for the samples S41 to S61, a Ta sputtered film (first conductor film) was formed on the polished Cu plated film, and an Au sputtered film was formed on the Ta sputtered film (first conductor film), and moreover an Au plated film (second conductor film) was formed thereon. The samples S42 to S62 thus obtained correspond to embodiments of the present invention.

Table 2 shows the results of measurement of surface roughness Ra on the surface of the Au plated film (second conductor film) for the above samples S12 to S62.

TABLE 2

| Sample No. | First conductor film | Third conductor film | Second conductor film | Surface roughness Ra | | | | |
|---|---|---|---|---|---|---|---|---|
| | | | | Center (nm) | Top (nm) | Bottom (nm) | Left (nm) | Right (nm) |
| S12 | Ti 5 nm | Au 5 nm | Au 200 nm | 10.3 | 8.3 | 9.6 | | |
| S22 | Ti 10 nm | Au 10 nm | Au 200 nm | 15.4 | 12.6 | 8.6 | | |
| S32 | Ti 5 nm | Au 5 nm | Au 200 nm | 13.4 | 8.3 | 10.0 | | |
| S42 | Ta 15 nm | Au 15 nm | Au 200 nm | 2.0 | 2.3 | 2.1 | 2.2 | 3.5 |
| S52 | Ta 5 nm | Au 5 nm | Au 200 nm | 2.3 | 2.4 | 2.2 | 2.3 | 2.7 |
| S62 | Ta 10 nm | Au 10 nm | Au 200 nm | 2.4 | 2.4 | 2.5 | 2.5 | 2.6 |

Referring to Table 2, in the conventional samples S12 to S32 in which the first conductor film was formed by a Ti film, the surface roughness Ra at "center" on the surface of the Au plated film (second conductor film) was in the range of 10.3 to 15.4 nm, but in the embodiment samples S42 to S62 in which the first conductor film was formed by a Ta film, it was in the range of 1.99 to 2.38 nm, which was about 1/10 that of the samples S12 to S32.

Moreover, in the samples S12 to S32, the surface roughness Ra at "top" on the surface of the Au plated film (second conductor film) was in the range of 8.3 to 12.6 nm, but in the embodiment samples S42 to S62 in which the first conductor film was formed by a Ta film, it was in the range of 2.33 to 2.42 nm, which was significantly improved as compared with that of the samples S12 to S32.

Furthermore, in the samples S12 to S32, the surface roughness Ra at "bottom" on the surface of the Au plated film (second conductor film) was in the range of 8.6 to 10.0 nm, but in the embodiment samples S42 to S62 in which the first conductor film was formed by a Ta film, it was in the range of 2.14 to 2.48 nm, which was significantly improved as compared with that of the samples S12 to S32.

Thus, it is clear that the present invention can significantly improve the surface property of the bump provided for wire bonding.

Meanwhile, as to polishing of the Cu film, it is clear from the comparison between Table 1 and Table 2 that the surface roughness Ra of the Cu film was greater in the samples S41 to S61 leading to the samples S42 to S62 corresponding to embodiments of the present invention than in the samples S11 to S31 leading to the samples S12 to S32.

3. Thin-Film Magnetic Head

A thin-film magnetic head according to the present invention is a typical example of the above thin-film device. Next will be described a thin-film magnetic head according to the present invention. FIGS. 13 to 17 show a thin-film magnetic head to be used in combination with a rapidly spinning magnetic recording medium such as a hard disk. Thin-film magnetic heads of this type are generally called "floating-type". However, the thin-film magnetic head according to the present invention is not necessarily required to be of the floating-type. For example, it may be a thin-film magnetic head which comes into contact with a magnetic recording medium.

Figure 13:
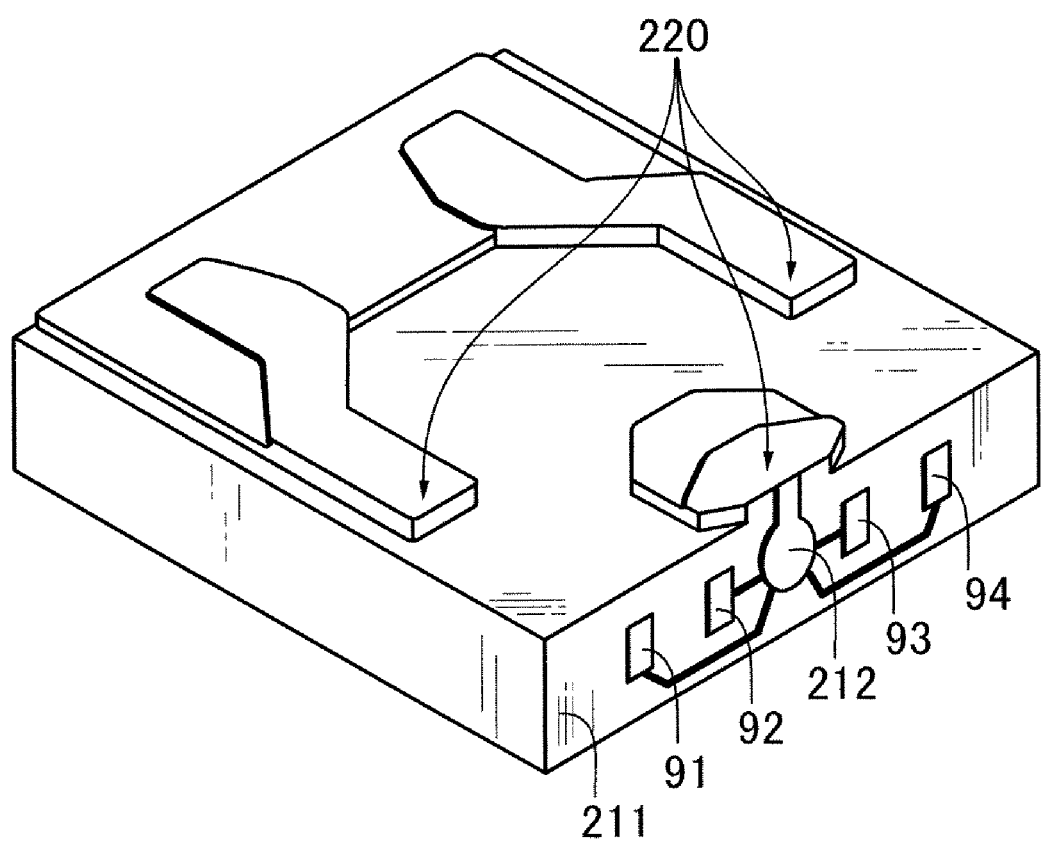
FIG. 13 is a perspective view of a thin-film magnetic head.

In the thin-film magnetic head, referring first to FIG. 13, a thin-film element 212 for performing both recording and reproducing processes is attached to one face of a substrate 211 made of, for example, a non-magnetic insulating material such as AlTiC to have a generally rectangular prism structure.

The substrate 211 has an air bearing surface 220 directly related to the floating characteristics, and the thin-film element 212 is attached to a trailing-side end face perpendicular to the air bearing surface 220.

The trailing-side end face is provided with bumps 91 to 94 for the thin-film element 212. In thin-film magnetic heads of this type, a recording element and a reproducing element are provided as the thin-film element 212, and generally, four bumps 91 to 94 are provided in accordance with these elements. That is, the two bumps 91, 92 are provided for the recording element, while the other two bumps 93, 94 are provided for the reproducing element.

Details of the thin-film element 212 are shown in FIGS. 14 to 17. In FIGS. 14 to 17, dimensions along X, Y and Z axes are called "width", "length" and "thickness/height", respectively. Along the Y axis, moreover, one side close to an air bearing surface 70 and the other side remote therefrom are designated by "front" and "rear", respectively, and being positioned forward and being positioned rearward may be expressed by "project" and "recede", respectively.

The thin-film magnetic head shown in FIGS. 14 to 17 is a complex-type head which can perform both recording and reproducing. In the thin-film magnetic head, an insulating film 2, a reproducing head portion 100A using magneto-resistive effect (MR effect), a separating film 9, a recording head portion 100B for performing a recording process in a perpendicular recording method, and an overcoat film 21 are layered on a substrate 1 in the mentioned order.

The substrate 1 is made of, for example, a ceramic material such as AlTiC ($Al_2O_3$.TiC), while the insulating film 2, the separating film 9 and the overcoat film 21 are made of, for example, a non-magnetic insulating material such as aluminium oxide ($Al_2O_3$: hereinafter merely referred to as "alumina").

The reproducing head portion 100A is formed, for example, by layering a lower read shield film 3, a shield gap film 4, and an upper read shield film 30 in the mentioned order. In the shield gap film 4, a reproducing element (or MR element 8) is embedded in such a manner as to be exposed on the air bearing surface 70. The air bearing surface 70 is uniquely defined with reference to one end face of the substrate 1 supporting a series of components from the insulating film 2 to the overcoat film 21, more specifically, refers to a surface containing one end face of the substrate 1.

Both the lower read shield film 3 and the upper read shield film 30 function to magnetically separate the MR element 8 from the surroundings and extend rearward from the air bearing surface 70. The lower read shield film 3 is made of, for example, a magnetic material such as a nickel-iron alloy (NiFe). In this case, the nickel-iron alloy (NiFe) may have a composition ratio of 80 wt. % of Ni and 20 wt. % of Fe. The upper read shield film 30 is formed, for example, by layering two upper read shield film portions 5, 7 with a non-magnetic film 6 interposed therebetween. Both the upper read shield film portions 5, 7 are made of, for example, a magnetic material such as a nickel-iron (NiFe) alloy. The non-magnetic film 6 is made of, for example, a non-magnetic material such as ruthenium (Ru) or alumina. The upper read shield film 30 is not necessarily required to have a layered structure but may have a single film structure of a magnetic material.

The shield gap film 4 functions to electrically separate the MR element 8 from the surroundings and is made of for example, a non-magnetic insulating material such as alumina. The MR element 8 uses giant magneto-resistive effect (GMR) or tunneling magneto-resistive effect (TMR), for example.

The recording head portion 100B is a so-called shield-type perpendicular recording element including a non-magnetic film 11, a first non-magnetic film 15, a magnetic pole film 50, a gap film 16 with an opening (or back gap 16BG) for magnetic connection, a coil film 18 embedded in an insulating film 19, and a magnetic film 60.

The magnetic pole film 50 extends rearward from the air bearing surface 70. The magnetic pole film 50 includes an auxiliary magnetic pole film 10, a second non-magnetic film 12, and a main magnetic pole film 40.

Figure 14:
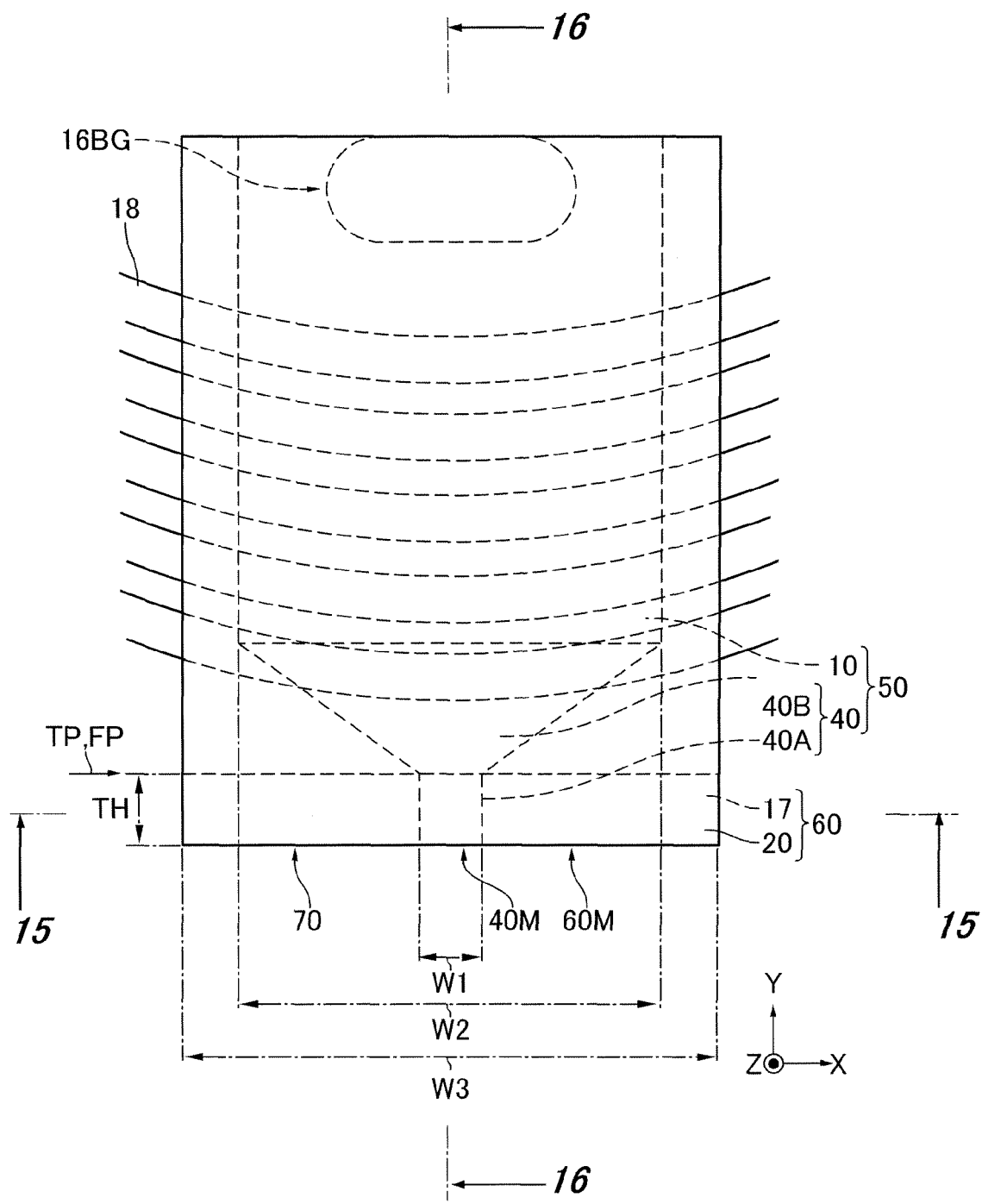
FIG. 14 is a plan view showing a magnetic pole structure in the thin-film magnetic head shown in FIG. 13.

The auxiliary magnetic pole film 10 extends from behind the air bearing surface 70 to the back gap 16BG. For example, the auxiliary magnetic pole film 10 is disposed on the leading side with respect to the main magnetic pole film 40 and has a rectangular plan shape (width W2), as shown in FIG. 14. The non-magnetic film 11 functions to electrically and magnetically separate the auxiliary magnetic pole film 10 from the surroundings and is made of, for example, a non-magnetic insulating material such as alumina.

For example, the second non-magnetic film 12 extends from the air bearing surface 70 to the forefront position of the auxiliary magnetic pole film 10 for connecting the auxiliary magnetic pole film 10 and the main magnetic pole film 40 and is made of a non-magnetic insulating material such as alumina or aluminium nitride. However, the extent of the second non-magnetic film 12 may be set arbitrarily.

The sectional shape of the second non-magnetic film 12 parallel to the air bearing surface 70 is U-shaped, as shown in FIG. 3, and the main magnetic pole film 40 is embedded inside the second non-magnetic film 12. The second non-magnetic film 12 is formed, for example, by ALD to have a uniform thickness around the main magnetic pole film 40 (along its bottom face and both side faces).

The first non-magnetic film 15 functions to electrically and magnetically separate the main magnetic pole film 40 from the surroundings. The first non-magnetic film 15 is embedded outside the second non-magnetic film 12 and is made of, for example, a non-magnetic insulating material such as alumina.

The first and second non-magnetic films 15, 12 are each made of a non-magnetic insulating material but have different compositions because of their different formation methods. More specifically, the first non-magnetic film 15 is formed such as by sputtering using an inert gas and contains the inert gas because of its formation method. It should be noted that examples of the inert gas include argon (Ar), krypton (Kr) and xenon (Xe). On the other hand, the second non-magnetic film 12 is formed such as by ALD not using any inert gas and contains no inert gas because of its formation method. Whether the first and second non-magnetic films 15, 12 contain any inert gas or not can be determined by using a composition analysis method such as scanning transmission electron microscopy (STEM)-energy-dispersive X-ray spectroscopy (EDS).

The first and second non-magnetic films 15, 12 are also different in the content of specific components because of their different formation methods. More specifically, since water and trimethyl aluminium (TMA) are used in ALD but not used in sputtering, the content of hydrogen (H) is larger in the second non-magnetic film 12 than in the first non-magnetic film 15.

Figure 15:
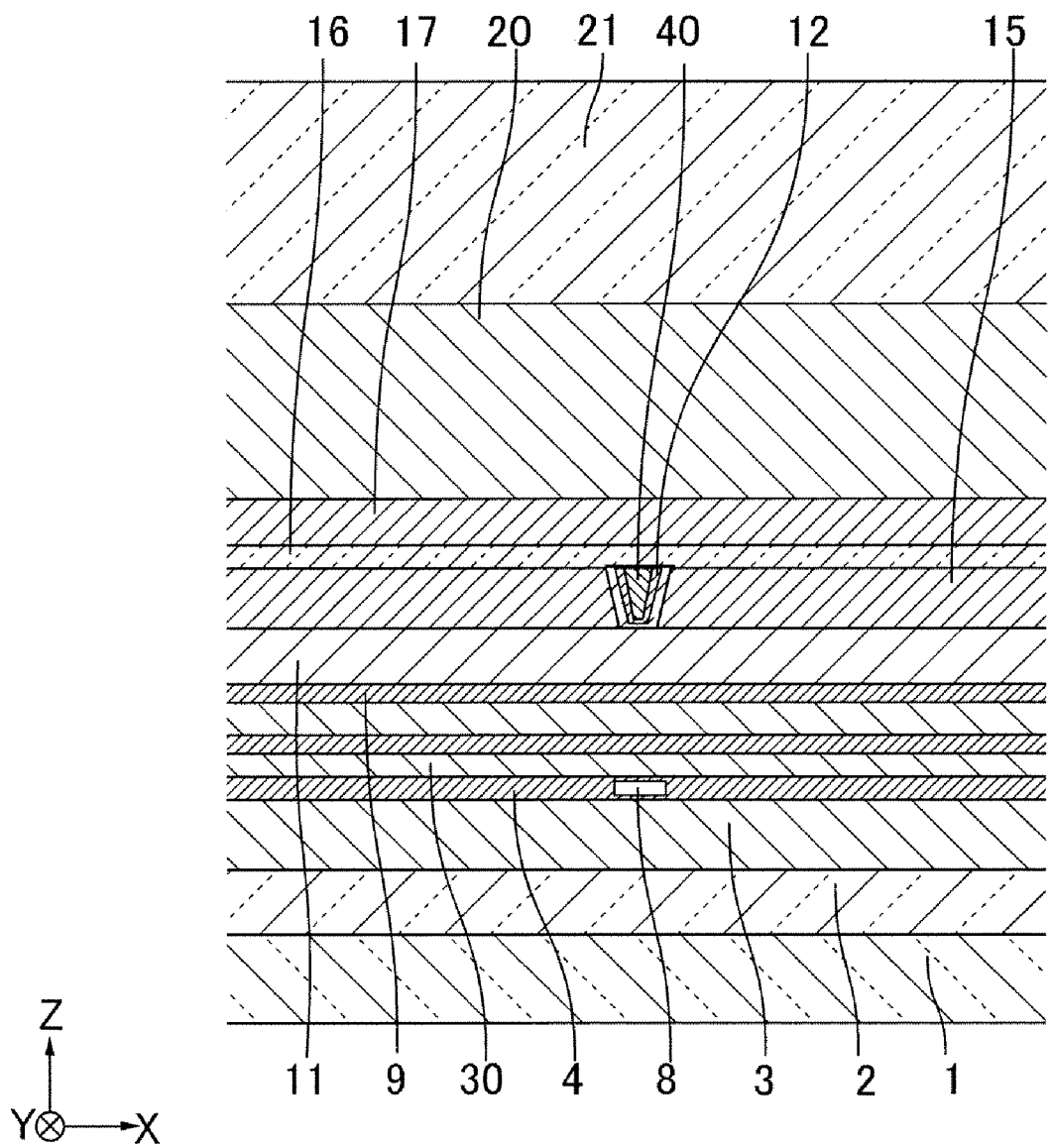
FIG. 15 is a sectional view taken along line 15-15 in FIG. 14.
Figure 16:
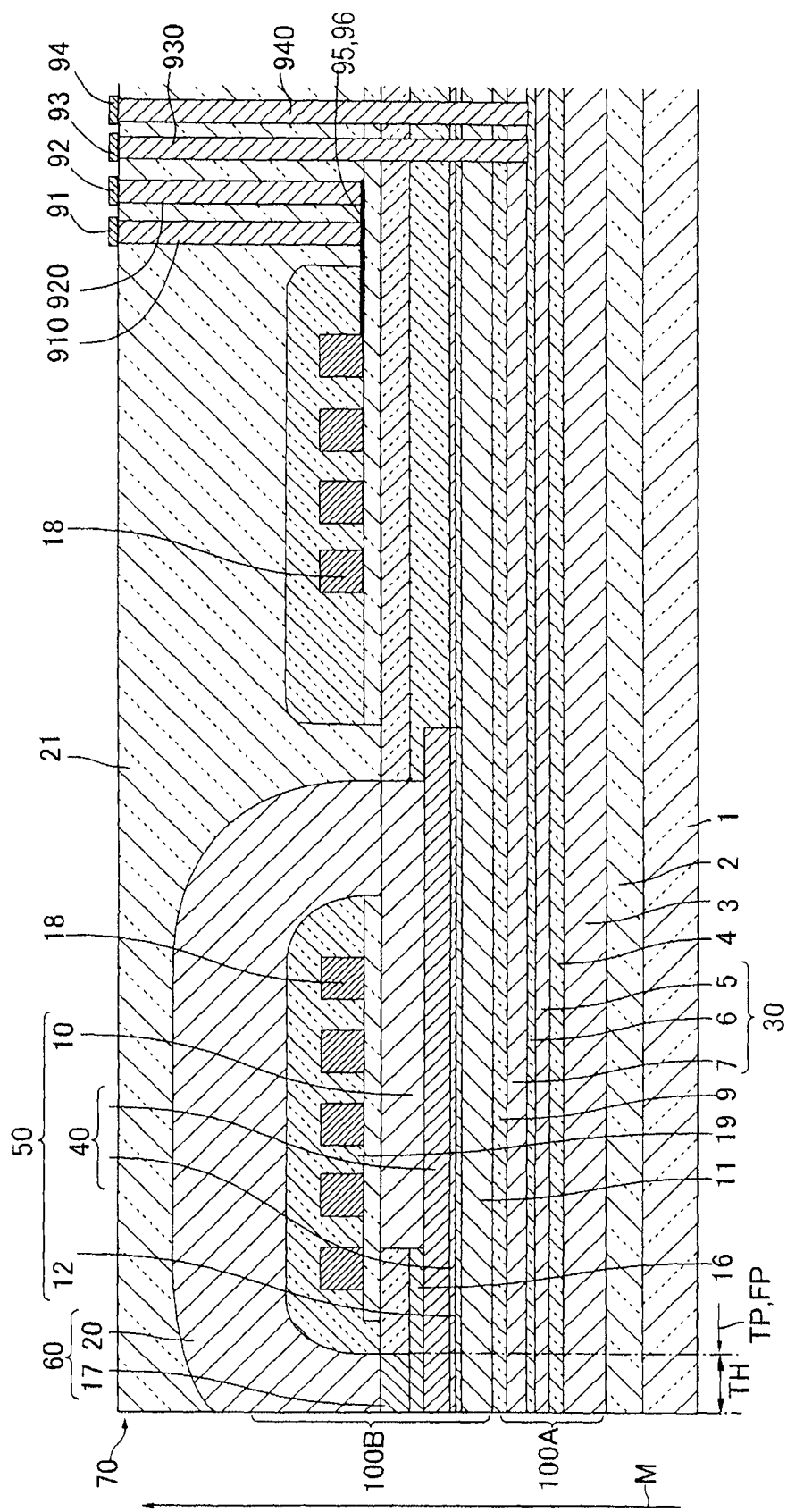
FIG. 16 is a sectional view taken along line 16-16 in FIG. 14.

The main magnetic pole film 40 extends from the air bearing surface 70 to the back gap 16BG. The main magnetic pole film 40 includes, for example, a small width portion 40A extending rearward from the air bearing surface 70 and a large width portion 40B connected to the rear end of the small width portion 40A, as shown in FIGS. 14 to 16. The small width portion 40A is a substantial magnetic flux emitting portion (so-called magnetic pole film) and has a constant width W1 which defines the recording track width. The large width portion 40B is a portion intended to supply a magnetic flux to the small width portion 40A and has a width W2 larger than the width W1. The width W2 of the large width portion 40B is almost constant. The large width portion 40B is gradually narrowed in its front portion toward the small width portion 40A. The position where the width of the main magnetic pole film 40 starts to increase from W1 to W2 is a so-called flare point FP.

Figure 17:
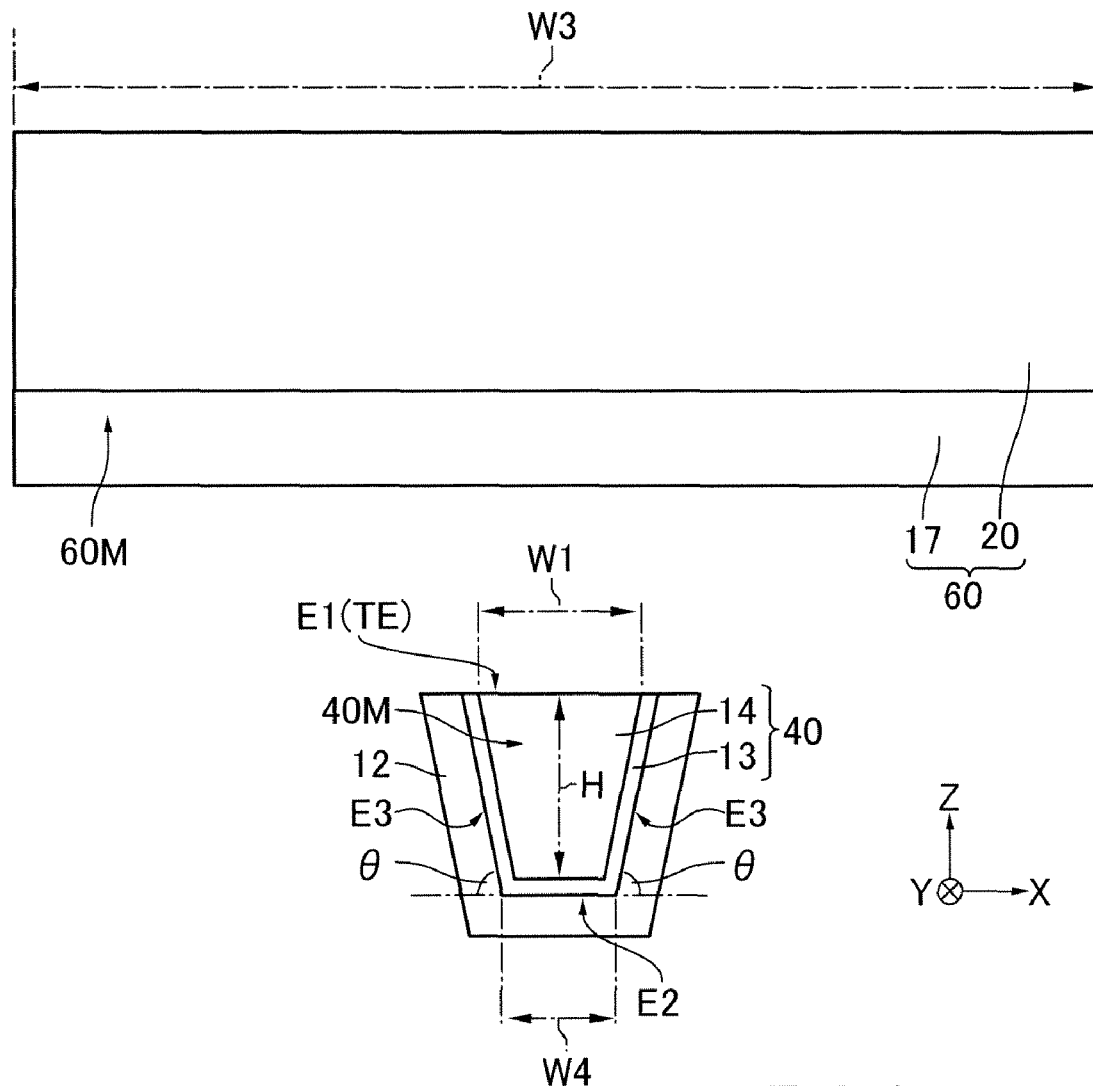
FIG. 17 is a plan view of a main magnetic pole film in the thin-film magnetic head shown in FIGS. 13 to 16.

An end face 40M of the main magnetic pole film 40 on the side close to the air bearing surface 70 is of, for example, an inverted trapezoid shape (height H), whose upper bottom and lower bottom are the longer side on the trailing side and the shorter side on the leading side, respectively, as shown in FIG. 17. Concretely, the end face 40M has a shape defined by an upper end edge E1 (width W1) on the trailing side, a lower end edge E2 (width W4) on the leading side, and two side edges E3, wherein the width W4 is smaller than the width W1. The upper end edge E1 is a substantial recording portion of the magnetic pole film 50, and its width W1 is approximately 0.2 µm or less. The bevel angle θ of the end face 40M (or angle between a direction along which the lower end edge E2 extends and the side edge E3) may be set arbitrarily, for example, within the range of less than 90 degrees.

The gap film 16 is a gap for magnetically separating the magnetic pole film 50 and the magnetic film 60 and is made of, for example, a non-magnetic insulating material such as alumina or a non-magnetic conductive material such as ruthenium. The thickness of the gap film 16 is approximately 0.03 to 0.1 µm.

The coil film 18 functions to generate a magnetic flux and is made of, for example, a highly conductive material such as copper (Cu). The coil film 18 is wound around the back gap 16BG to have a winding structure (or spiral structure), as shown in FIG. 14.

The insulating film 19 functions to electrically separate the coil film 18 from the surroundings and is made of, for example, a non-magnetic insulating material such as a photoresist or a spin on glass (SOG) which becomes liquid when heated. The forefront position of the insulating film 19 is a throat height zero position TP, and the distance between the throat height zero position TP and the air bearing surface 70 is a so-called "throat height TH". For example, FIG. 14 shows a state where the throat height zero position TP matches the flare point FP.

The magnetic film 60 functions to absorb a spreading component of a magnetic flux emitted from the magnetic pole film 50 so as to increase the gradient of the perpendicular magnetic field and also absorb a magnetic flux returning from the recording medium so as to circulate the magnetic flux between the recording head portion 100B and a magnetic recording medium 80. The magnetic film 60, which extends rearward from the air bearing surface 70 on the trailing side of the magnetic pole film 50, is separated from the magnetic pole film 50 by the gap film 16 at its front but connected to the magnetic pole film 50 through the back gap 16BG at its rear. On the side close to the air bearing surface 70, the magnetic film 60 has an end face 60M which is, for example, of a rectangular shape having a width W3 larger than the width W1, as shown in FIG. 14. The magnetic film 60 includes, for example, a write shield film 17 and a return yoke film 20 which are distinct from each other.

The write shield film 17 functions to mainly increase the gradient of the perpendicular magnetic field and is made of, for example, a high saturation magnetic flux density material such as an cobalt-nickel-iron alloy (CoNiFe) or an iron-based alloy. Particularly by absorbing a spreading component of a magnetic flux emitted from the magnetic pole film 50, the write shield film 17 functions to: (1) increase the magnetic field gradient of the perpendicular magnetic field; (2) decrease the recording width; and (3) incorporate an oblique magnetic field component into the perpendicular magnetic field. However, the write shield film 17 may additionally function to circulate the magnetic flux like the return yoke film 20. The write shield film 17 is adjacent to the gap film 16 and extends rearward from the air bearing surface 70 to have its rear end adjacent to the insulating film 19. Thus, the write shield film 17 serves to define the forefront position (throat height zero position TP) of the insulating film 19.

The return yoke film 20 functions to circulate the magnetic flux and is made of, for example, a magnetic material similar to that of the write shield film 17. The return yoke film 20 extends from the air bearing surface 70, through above the insulating film 19, to the back gap 16BG on the trailing side of the write shield film 17 and is connected to the write shield film 17 at its front but to the magnetic pole film 50 at its rear through the back gap 16BG, as shown in FIG. 16.

The overcoat film 21 functions to protect the thin-film magnetic head and is made of, for example, a non-magnetic insulating material such as alumina.

In the above thin-film magnetic head, two lead conductor films extending from both ends of the coil film 18 of the recording element correspond to (the lead conductor films 95, 910) and (96, 920) described with reference to FIGS. 1 to 13. The lead conductor film (95, 910) has a planar portion 95 and a projecting portion 910 and is embedded in the overcoat film 21 except one end face of the projecting portion 910. The projecting portion 910 is a Cu plated film projecting from the planar portion 95 with its one end face substantially flush with the surface of the overcoat film 21.

The other lead conductor film (96, 920) also has a planar portion 96 and a projecting portion 920 and is embedded in the overcoat film 21 except one end face of the projecting portion 920. The projecting portion 920 is a Cu plated film projecting from the planar portion 96 with its one end face substantially flush with the surface of the overcoat film 21.

The end faces of the projecting portions 910, 920 are provided with bumps 91, 92. The bumps 91, 92 have the film structure shown in FIG. 3. Describing again with reference to FIG. 3, at first, the bump 91 includes a first conductor film 911, a second conductor film 912 and a third conductor film 913. The first conductor film 911 is adhered onto the lead conductor film 910 such as by sputtering and is a Ta film or made of a material having a comparably fine crystal structure. The second conductor film 912 is an Au plated film which is directly or indirectly formed on the first conductor film 911. The third conductor film 913 interposed between the first conductor film 911 and the second conductor film 912 is a film which is formed such as by sputtering and contains Au as a main component.

The bump 92 also includes a first conductor film 921, a second conductor film 922 and a third conductor film 923. The first conductor film 921 is adhered onto the lead conductor film 920 such as by sputtering and is a Ta film or made of a material having a comparably fine crystal structure. The second conductor film 922 is a plated film which is directly or indirectly formed on the first conductor film 921 and contains Au as a main component. The bump 92 may also have the third conductor film 923 which is formed between the first conductor film 921 and the second conductor film 922 such as by sputtering and contains Au as a main component.

The first conductor films 911 and 921, which are Ta films or made of a material having a comparably fine crystal structure, may have a film thickness in the range of 5 to 15 nm.

The Ta film has a considerably finer crystal film structure than a conventionally used Ti film. Accordingly, even if large crystals are formed inside the lead conductor films 910, 920 by their main component Cu, they can be shut off by the Ta films 911, 921, thereby preventing the Au plated films 912, 922 formed on the Ta films 911, 921 from reflecting the crystal shape of Cu. Thus, the bumps 91, 92 formed by the Au plated films 912, 922 have an improved surface property. The specific effects are the same as described with reference to the experimental data in Table 1.

The reproducing element has a similar lead conductor structure to that of the above recording element, in which the bumps 93, 94 are adhered to the end faces of projecting portions 930, 940. The bumps 93, 94 have the film structure shown in FIG. 3, like the bumps 91, 92 provided in the recording element.

3. Head Assembly

The present invention further discloses a head assembly. The head assembly includes the foregoing thin-film magnetic head and a head support device. The head support device supports the thin-film magnetic head in such a manner as to permit rolling and pitching of the thin-film magnetic head. In the present invention, examples of the head assembly include an HGA (head gimbal assembly) in which the thin-film magnetic head is mounted on a head support device (or gimbal) and an HAA (head arm assembly) in which the HGA is mounted on an arm.

Figure 18:
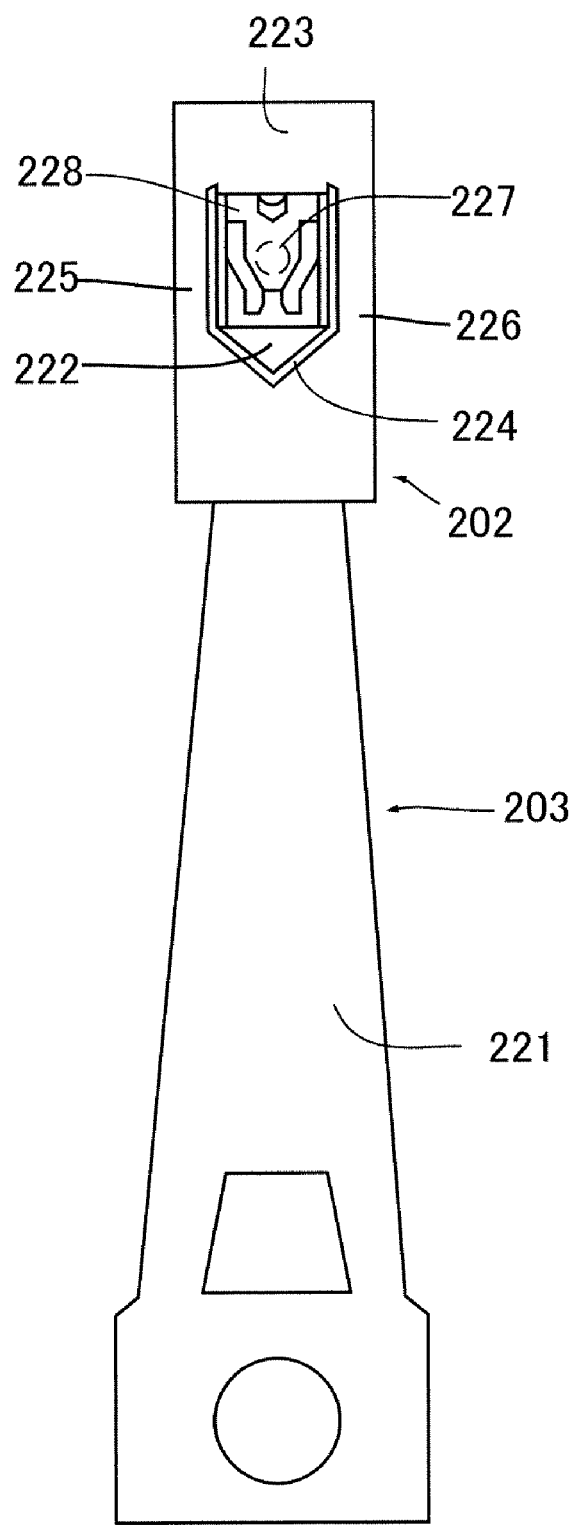
FIG. 18 is a plan view of an HGA according to the present invention.
Figure 19:
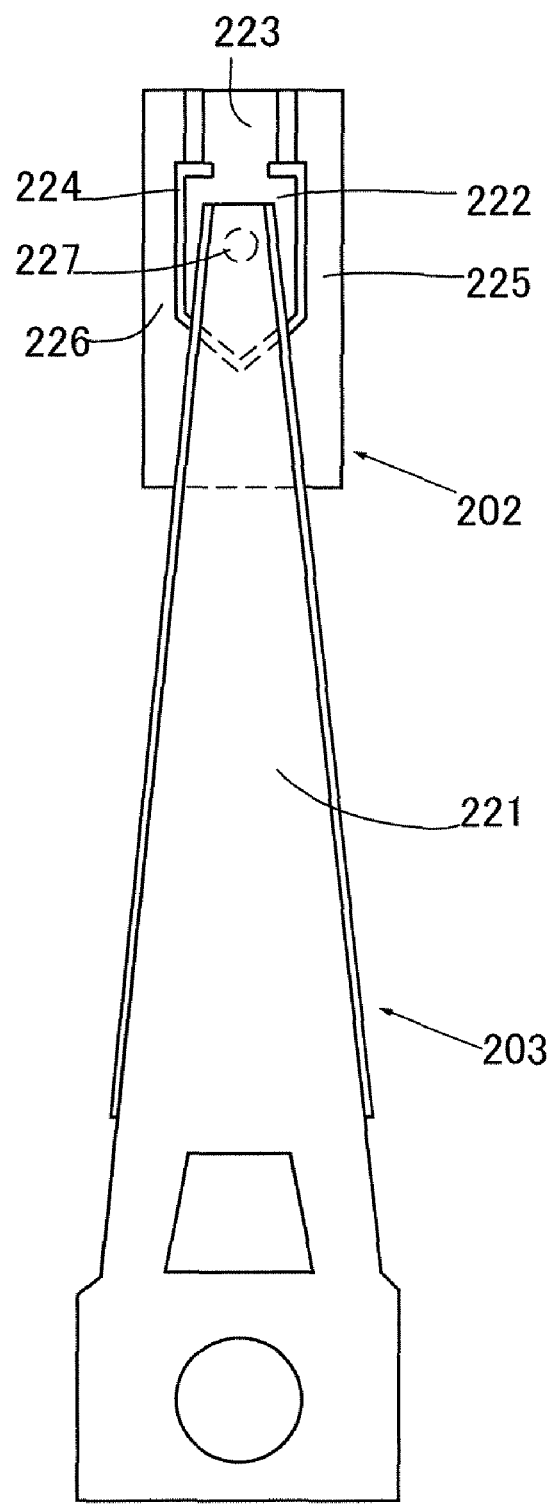
FIG. 19 is a bottom view of the HGA shown in FIG. 18.

FIG. 18 is a front view of a head assembly according to the present invention, and FIG. 19 is a bottom view of the head assembly shown in FIG. 18. The illustrated head assembly is an HGA including a suspension 203 and a thin-film magnetic head 228. The suspension 203 includes a load beam 221 and a flexure 202. The load beam 221 has a load dimple 227 in proximity to a free end on a centrally-extending longitudinal axis.

The flexure 202 is formed from a thin leaf spring and subjected to a pressing load from the load dimple 227 with one side thereof attached to one side of the load beam 221 where the load dimple 227 is located. The thin-film magnetic head 228 is attached to the other side of the flexure 202. The flexure 202 is bonded to the load beam 221 at the side where the load dimple 227 is located.

The flexure 202 has a tongue portion 222 in the center thereof. At one end, the tongue portion 222 is bonded to a lateral frame portion 223 of the flexure 202. Both ends of the lateral frame portion 223 of the flexure 202 are connected to outer frame portions 225, 226. A groove 224 is formed between the tongue portion 222 and the outer frame portions 225, 226, extending around the tongue portion 222. The thin-film magnetic head 228 is attached to one side of the tongue portion 222 through an adhesive or the like to be in spring contact with the tip of the load dimple 227.

One face of the thin-film magnetic head 228 opposite to the air bearing surface of the slider is attached to the tongue portion 222 of the suspension 203. Flexible leads and the like not shown in the drawings are connected to the thin-film magnetic head 228.

Figure 20:
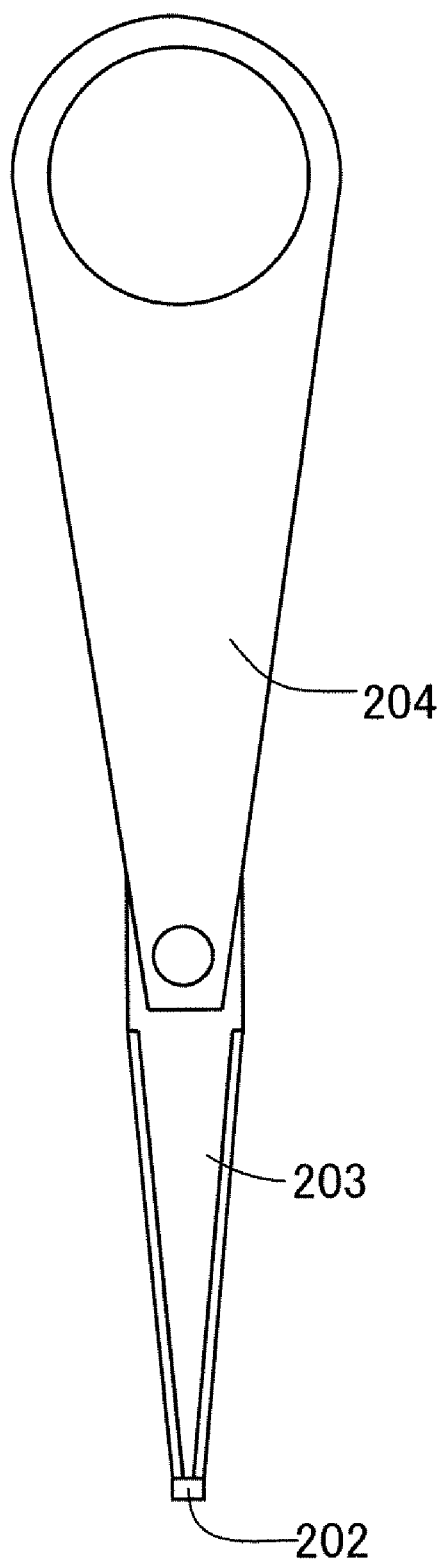
FIG. 20 is a plan view of an HAA according to the present invention.

FIG. 20 is a front view of an HAA. The illustrated HAA includes the suspension 203, the thin-film magnetic head 228 and an arm 204. The arm 204 is integrally formed of a suitable non-magnetic metallic material such as an aluminium alloy. The arm 204 is provided with a mounting hole. The mounting hole is used for mounting on a positioning device provided in a magnetic disk apparatus. One end of the suspension 203 is secured to the arm 204, for example, with a ball connecting structure.

4. Magnetic Recording/Reproducing Apparatus

Figure 21:
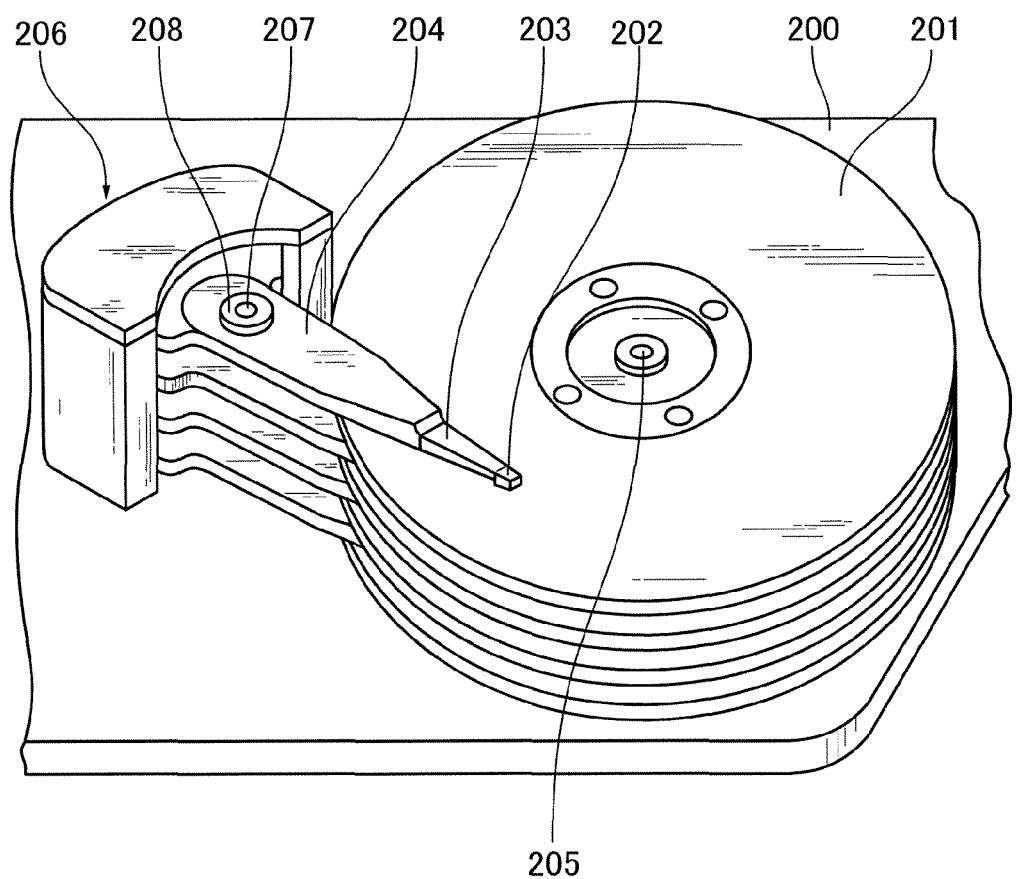
FIG. 21 is a perspective view of a magnetic recording apparatus according to the present invention.

Next will be described a structure of a magnetic recording apparatus mounted with the thin-film magnetic head according to the present invention. FIG. 21 shows the structure of the magnetic recording apparatus. The magnetic recording apparatus, which is mounted with the foregoing thin-film magnetic head, is, for example, a hard disk drive.

As shown in FIG. 21, for example, the magnetic recording apparatus includes, within a case 200, a plurality of magnetic disks (e.g., hard disks) 201 corresponding to the magnetic recording medium 80 for magnetically recording information, a plurality of suspensions 203 disposed corresponding to the respective magnetic disks 201 and supporting the thin-film magnetic heads at their one ends, and a plurality of arms 204 supporting the other ends of the suspensions 203. The magnetic disks 201 are rotatable about a spindle motor 205 which is fixed to the case 200. The arms 204 are connected to an actuator 206 which functions as a power source and are pivotable through a bearing 208 about a fixed shaft 207 which is fixed to the case 200.

The actuator 206 is constructed to include, for example, a driving source such as a voice coil motor. For example, the magnetic recording apparatus is a model where the plurality of arms 204 are pivotable about the fixed shaft 207 in an integrated manner. In FIG. 21, the case 200 is shown partially cut-out to make it easy to see the internal structure of the magnetic recording apparatus.

The thin-film magnetic head 228 is a thin-film magnetic head according to the present invention. When the magnetic disk 201 rotates for recording or reproducing information, an air flow generated between the recording surface (or thin-film magnetic head-facing surface) of the magnetic disk 201 and the air bearing surface 220 is utilized to let the thin-film magnetic head take off from the recording surface of the magnetic disk 201.

Figure 22:
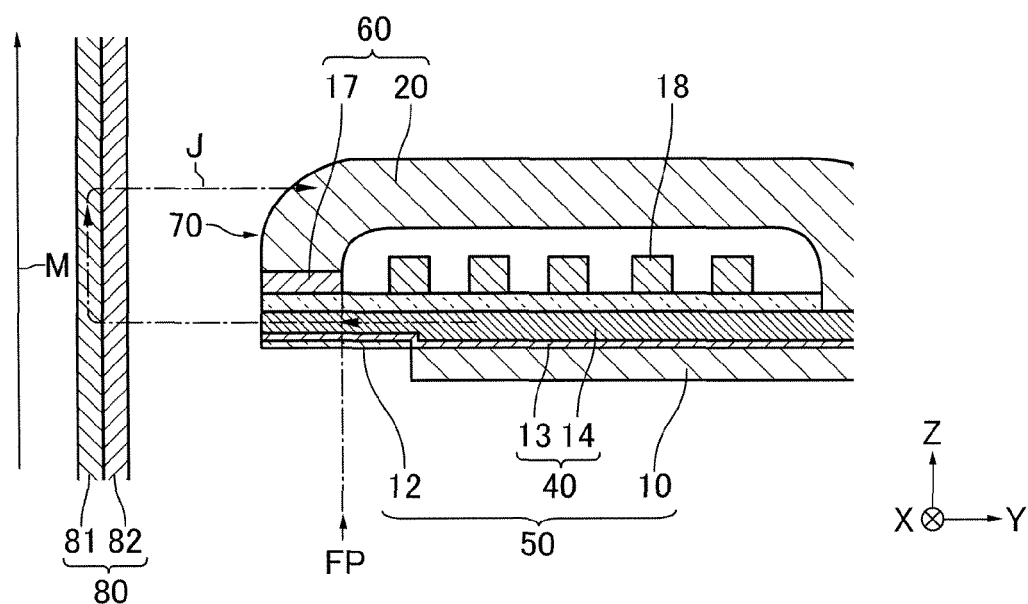
FIG. 22 is a view illustrating recording operation of the magnetic recording/reproducing apparatus shown in FIG. 21.

As shown in FIG. 22, the magnetic recording medium 80 includes, for example, a magnetization film 81 and a soft magnetic film 82 disposed close to and remote from the thin-film magnetic head, respectively. The magnetization film 81 functions to magnetically record information, while the soft magnetic film 82 functions as a path of a magnetic flux (so-called flux path) in the magnetic recording medium 80. The magnetic recording medium 80 of this type is generally called "double layer recording medium" for perpendicular recording. Needless-to-say, the magnetic recording medium 80 may include another layer, for example, in addition to the above magnetization film 81 and soft magnetic film 82.

The upwardly directed arrow shown in FIG. 21 indicates the moving direction M along which the magnetic recording medium 80 relatively moves with respect to the thin-film magnetic head. Assuming that the movement of the magnetic recording medium 80 moving in the moving direction M is a kind of flow, the foregoing "trailing side" refers to a flow-out side (or front side in the moving direction M), and particularly in this case, refers to an upper side in the thickness direction (Z-axis direction). On the other hand, a flow-in side (or rear side in the moving direction M) is referred to as "leading side", and particularly in this case, corresponds to a lower side in the thickness direction. The upper end edge E1, which is a recording portion of the main magnetic pole film 40, is called "trailing edge TE", and its width W1 is called "trailing edge width".

Recording and reproducing operations to be performed by the above magnetic recording/reproducing apparatus will be described with reference to FIG. 22. When recording information, specifically, a recording magnetic flux J is generated as a current flows from an external circuit not shown in the drawings to the coil film 18 of the recording head portion 100B. After absorbed in the auxiliary magnetic pole film 10 and the main magnetic pole film 40 of the magnetic pole film 50, the magnetic flux J flows toward the narrow width portion 40A. At this time, since the magnetic flux J is focused because of narrowing at the flare point FP, it is finally concentrated in the vicinity of the trailing edge TE. When the magnetic flux J concentrated in the vicinity of the trailing edge TE is emitted to generate a perpendicular magnetic field, the magnetization film 81 is magnetized by the perpendicular magnetic field, thereby magnetically recording information on the magnetic recording medium 80.

In this case, the gradient of the perpendicular magnetic field increases because the spreading component of the magnetic flux J is absorbed in the write shield film 17. The magnetic flux J absorbed in the write shield film 17 is resupplied to the magnetic pole film 50 through the return yoke film 20.

After magnetization of the magnetization film 81, the magnetic flux J emitted from the magnetic pole film 50 toward the magnetic recording medium 80 is absorbed in the return yoke film 20 through the soft magnetic film 82. At this time, a part of the magnetic flux J is also absorbed in the write shield film 17. The magnetic flux J absorbed in the write shield film 17 and the return yoke film 20 is also resupplied to the magnetic pole film 50. This enables circulation of the magnetic flux J between the recording head portion 100B and the magnetic recording medium 80.

Here, since the thin-film magnetic head according to the present invention can achieve both the improvement in overwrite characteristic by increasing the saturation magnetic flux density and the improvement in pole erase by decreasing the coercive force, there can be obtained a magnetic recording/reproducing apparatus in which the pole erase is improved and at the same time, sufficient overwrite characteristic (OW) can be assured with respect to the magnetic recording medium 80 that has a high coercive force for improvement in recording capacity.

The present invention has been described in detail above with reference to preferred embodiments. However, obviously those skilled in the art could easily devise various modifications of the invention based on the technical concepts underlying the invention and teachings disclosed herein.

What is claimed is:

1. A thin-film device comprising a thin-film element, a lead conductor film, an insulating film and a bump, wherein
    said thin-film element comprises at least one of an electromagnetic conversion element, a passive element and an active element;
    said lead conductor film is inside said insulating film, comprises Cu as a main component and is connected to said thin-film element;
    said bump is outside said insulating film and comprises at least a first conductor film and a second conductor film;
    said first conductor film is adhered onto said lead conductor film and comprises Ta; and
    said second conductor film is a plated film which is directly or indirectly formed on said first conductor film and comprises Au as a main component.

2. The thin-film device of claim 1, wherein
    said lead conductor film has a planar portion and a projecting portion;
    said projecting portion is a plated film projecting from said planar portion; and
    said bump is adhered onto said projecting portion.

3. The thin-film device of claim 1, wherein said insulating film is a ceramic film.

4. The thin-film device of claim 1, wherein said first conductor film has a film thickness in the range of 5 to 15 nm.

5. The thin-film device of claim 1, wherein said bump further comprises a third conductor film comprising Au as a main component between said first conductor film and said second conductor film.

6. A thin-film magnetic head comprising a slider, at least one electromagnetic conversion element, a lead conductor film, an insulating film and a bump, wherein
    said electromagnetic conversion element is supported by said slider;
    said lead conductor film is inside said insulating film, comprises Cu as a main component and is connected to said electromagnetic conversion element;
    said bump is outside said insulating film and comprises at least a first conductor film and a second conductor film;
    said first conductor film is adhered onto said lead conductor film and comprises Ta; and
    said second conductor film is a plated film which is directly or indirectly formed on said first conductor film and comprises Au as a main component.

7. The thin-film magnetic head of claim 6, wherein
    said lead conductor film has a planar portion and a projecting portion;
    said projecting portion is a plated film projecting from said planar portion; and
    said bump is adhered onto said projecting portion.

8. The thin-film magnetic head of claim 6, wherein said insulating film is a ceramic film.

9. The thin-film magnetic head of claim 6, wherein said first conductor film has a film thickness in the range of 5 to 15 nm.

10. The thin-film magnetic head of claim 6, wherein said bump further comprises a third conductor film containing Au as a main component between said first conductor film and said second conductor film.

11. The thin-film magnetic head of claim 6, wherein said electromagnetic conversion element includes a perpendicular recording element and a reproducing element.

12. A head assembly comprising a thin-film magnetic head and a head support device, wherein
    said thin-film magnetic head includes a slider, at least one electromagnetic conversion element, a lead conductor film, an insulating film and a bump;
    said electromagnetic conversion element is supported by said slider;
    said lead conductor film is inside said insulating film, comprises Cu as a main component and is connected to said electromagnetic conversion element;
    said bump is outside said insulating film and comprises at least a first conductor film and a second conductor film;
    said first conductor film is adhered onto said lead conductor film and comprises Ta;
    said second conductor film is a plated film which is directly or indirectly formed on said first conductor film and comprises Au as a main component; and
    said head support device supports said thin-film magnetic head in such a manner as to permit rolling and pitching of said thin-film magnetic head.

13. A magnetic recording/reproducing apparatus comprising a head assembly and a magnetic recording medium, wherein
    said head assembly includes a thin-film magnetic head and a head support device;
    said thin-film magnetic head includes a slider, at least one electromagnetic conversion element, a lead conductor film, an insulating film and a bump
    said electromagnetic conversion element is supported by said slider;
    said lead conductor film is inside said insulating film, comprises Cu as a main component and is connected to said electromagnetic conversion element;
    said bump is outside said insulating film and comprises at least a first conductor film and a second conductor film;
    said first conductor film is adhered onto said lead conductor film and comprises Ta;
    said second conductor film is a plated film which is directly or indirectly formed on said first conductor film and comprises Au as a main component;
    said head support device supports said thin-film magnetic head in such a manner as to permit rolling and pitching of said thin-film magnetic head; and said head assembly cooperates with said magnetic recording medium to record magnetic data on said magnetic recording medium or reproduce magnetic data from said magnetic recording medium.

14. A method for manufacturing the thin-film device of claim 1,
wherein the method comprises, for the formation of said bump, forming on said lead conductor film said first conductor film comprising Ta; and then
directly or indirectly forming on said first conductor film said second conductor film which is a plated film comprising Au as a main component.

15. The manufacturing method of claim 14,
wherein
said lead conductor film has a planar portion and a projecting portion; and
said projecting portion is a plated film projecting from said planar portion, and wherein
polishing is performed such that one end face of said projecting portion appears substantially flush with a surface of said insulating film, and then
said bump is formed on said one end face of said projecting portion.

16. The manufacturing method of claim 15, wherein said first conductor film is formed by sputtering to have a film thickness in the range of 5 to 15 nm.

17. The manufacturing method of claim 16, wherein
after formation of said first conductor film, a third conductor film comprising Au as a main component is formed on said first conductor film by sputtering, and then
said second conductor film is formed by plating.

18. The manufacturing method of claim 14, wherein said thin-film device is a thin-film magnetic head.

* * * * *